United States Patent
Chen et al.

(10) Patent No.: US 8,328,380 B2
(45) Date of Patent: Dec. 11, 2012

(54) LIGHT MODULE FOR LCD BACKLIGHT MODULE

(75) Inventors: Irene Chen, Hsinchu (TW); Jian-Shihn Tsang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/370,318

(22) Filed: Feb. 10, 2012

(65) Prior Publication Data

US 2012/0140449 A1 Jun. 7, 2012

Related U.S. Application Data

(62) Division of application No. 12/435,891, filed on May 5, 2009, now Pat. No. 8,118,442.

(30) Foreign Application Priority Data

May 6, 2008 (TW) ................................ 97116590 A

(51) Int. Cl.
*G02F 1/13357* (2006.01)

(52) U.S. Cl. .................. 362/97.3; 362/311.02; 362/97.2

(58) Field of Classification Search ........ 362/97.1–97.4, 362/330, 244, 246, 311.02, 339, 340, 561, 362/800; 385/61–63

See application file for complete search history.

(56) References Cited

U.S. PATENT DOCUMENTS

| | | | | |
|---|---|---|---|---|
| 6,227,679 B1* | 5/2001 | Zhang et al. | | 362/236 |
| 6,470,046 B1* | 10/2002 | Scott | | 375/222 |
| 7,658,513 B2* | 2/2010 | Peck | | 362/298 |
| 7,976,187 B2* | 7/2011 | Villard | | 362/246 |
| 8,118,442 B2* | 2/2012 | Chen et al. | | 362/97.3 |
| 2004/0084681 A1* | 5/2004 | Roberts | | 257/79 |
| 2006/0039139 A1* | 2/2006 | Maglica et al. | | 362/202 |
| 2006/0221592 A1* | 10/2006 | Nada et al. | | 362/29 |
| 2006/0285311 A1* | 12/2006 | Chang et al. | | 362/97 |
| 2010/0014281 A1* | 1/2010 | Kim | | 362/97.2 |

* cited by examiner

*Primary Examiner* — Bao Q Truong

(74) *Attorney, Agent, or Firm* — Altis Law Group, Inc.

(57) ABSTRACT

A light module of an LCD backlight module includes a circuit board and a plurality of light-emitting diodes (LEDs) arranged on the circuit board. Each of the LEDs has a wide far-field pattern and is without a reflector, and each of the LEDs includes at least one LED chip and a molding unit packaging the LED chip. The LED chip is electrically connected to the circuit board and is also suitable for backlighting use. When a light-emitting angle of each of the LEDs is at 120 degrees, a light intensity thereof is still more than 50% of the intensity at frontage.

12 Claims, 11 Drawing Sheets

(RRIOR ART)

(RRIOR ART)

LIGHT MODULE FOR LCD BACKLIGHT MODULE

CROSS-REFERENCE TO RELATED APPLICATION

This application is a divisional application of patent application Ser. No. 12/435,891 filed on May 5, 2009 and assigned to the same assignee of the present application.

1. TECHNICAL FIELD

The present disclosure relates to an electronic appliance, and more particularly, to a light module of a liquid crystal display (LCD).

2. DESCRIPTION OF THE RELATED ART

Light emitting diodes (LEDs) are commonly applied to general household products. For example, indication apparatuses, illumination apparatuses, uniform surface illuminants, and backlight modules for LCDs utilize LEDs.

FIG. 1 illustrates a schematic cross-sectional diagram of an LED in accordance with prior art. The LED uses an encapsulation body 110, which is a plastic leadframe chip carrier (PLCC). Such an LED can be adapted to the backlight module of a direct-light type LCD using RGB three-color LEDs.

The LED, as shown in FIG. 1, emits light in a far-field pattern as shown in FIG. 2. In FIG. 1 and FIG. 2, the light-emitting angle of an LED chip 116 is not larger than 120 degrees. FIG. 3 illustrates the relationship of the light-emitting angle and the intensity.

Referring to FIG. 2 and FIG. 3, the far-field pattern of the LED device using the chip 116 of FIG. 1 is quite narrow; there is nearly no light at 120 degrees. In other words, the light-emitting area of the LED is highly concentrated.

The cup opening 102 of the reflection device 100 of the LED has a depth. If such LED is used for a light module of the backlight module of a liquid crystal display (LCD), the backlight module is not easy to manufacture with a thin profile. In addition, the concentration of the light-emitting area is not easy to use or mix as uniform planar illuminant for a planar light module.

Therefore, there is a demand to provide a light module of an LCD backlight module that can function as a uniform planar illuminant by the mixing of emitted light and as a thin backlight module of a liquid crystal display.

SUMMARY OF THE DISCLOSURE

One aspect of the present disclosure provides a light module of a backlight module of a liquid crystal display. The backlight module is easily manufactured with a thin profile, and can easily mix emitted light to form a uniform planar illuminant.

Another aspect of the present disclosure provides a direct type light module for LCD backlight module of a liquid crystal display.

The present embodiment discloses a light module of a backlight module for LCD backlight module including a circuit board and a plurality of light-emitting diodes (LEDs). The plurality of LEDs is arranged on the circuit board. Each of the LEDs has a wide far-field pattern, and each of the LEDs includes an LED chip and a molding unit packaging the LED chip. The LED chips are electrically connected to the circuit board.

By using the light module, the backlight module is easily manufactured with a thin profile and can easily mix emitted light to form a uniform planar illuminant.

Moreover, the disclosure further provides a direct type light module for an LCD backlight module including a plurality of light modules. Each light module includes a circuit board and a plurality of LEDs arranged on the circuit board. No LED has a reflection portion. The plurality of the LEDs is connected to the circuit board. The plurality of light modules is arranged with each other for forming a plane, and the plurality of LEDs of different light modules is interlaced into a planar illuminant.

BRIEF DESCRIPTION OF THE DRAWINGS

The objectives and advantages of the present disclosure will be apparent upon reading the description and upon reference to the accompanying drawings in which.

DETAILED DESCRIPTION

The present disclosure relates to a light module. The implementation of the present disclosure is not restricted to that known only to people skilled in the art. The preferred embodiments are discussed in detail below. It should be appreciated, however, that the present disclosure provides many applicable inventive concepts that can be embodied in a wide variety of specific contexts. The specific embodiments below are merely illustrative of specific ways to make and use the disclosure, and do not limit the scope of the disclosure.

Figure 4:
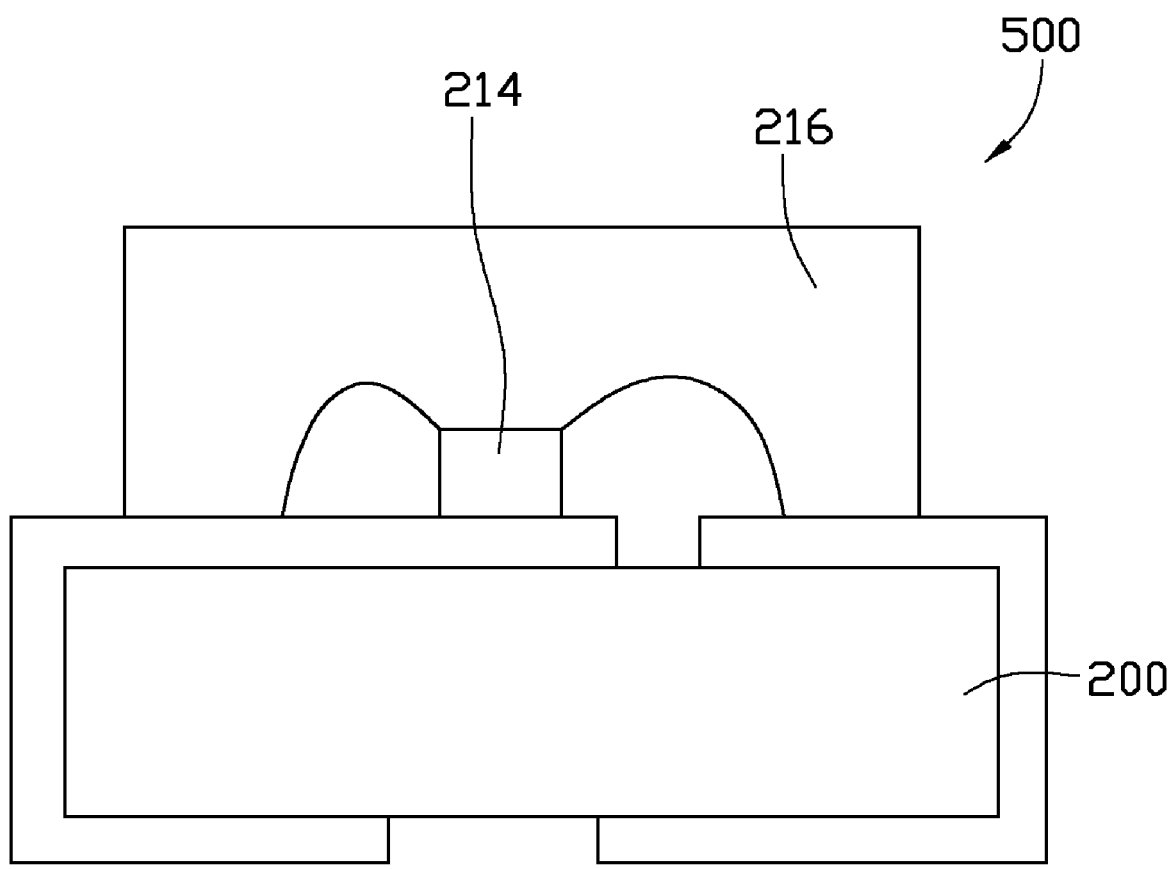
FIG. 4 illustrates the cross-sectional view of an LED in accordance with a first embodiment of the present disclosure.

FIG. 4 illustrates a cross-sectional view of an LED in accordance with a first embodiment of the present disclosure. An LED 500 includes an LED chip 214, and may further include a molding unit 216 to encapsulate the LED chip 214. The LED chip 214 may be packaged by the molding unit 216 via a transfer-molding or an inject-molding process.

The molding unit 216 may be epoxy, silicone, or mixture of epoxy and silicone.

The LED 500 may further include a circuit board 200. According to a first embodiment of the present disclosure, there is a plurality of LEDs 500. The plurality of LEDs 500 is arranged on the circuit board 200.

The LED chips 214 of the LEDs 500 each are electrically connected to the circuit board 200.

The circuit board 200 may be a printed circuit board (PCB), a ceramic board, an aluminum board, an alumina board, an aluminum nitride board or copper clad laminate (CCL).

Figure 5:
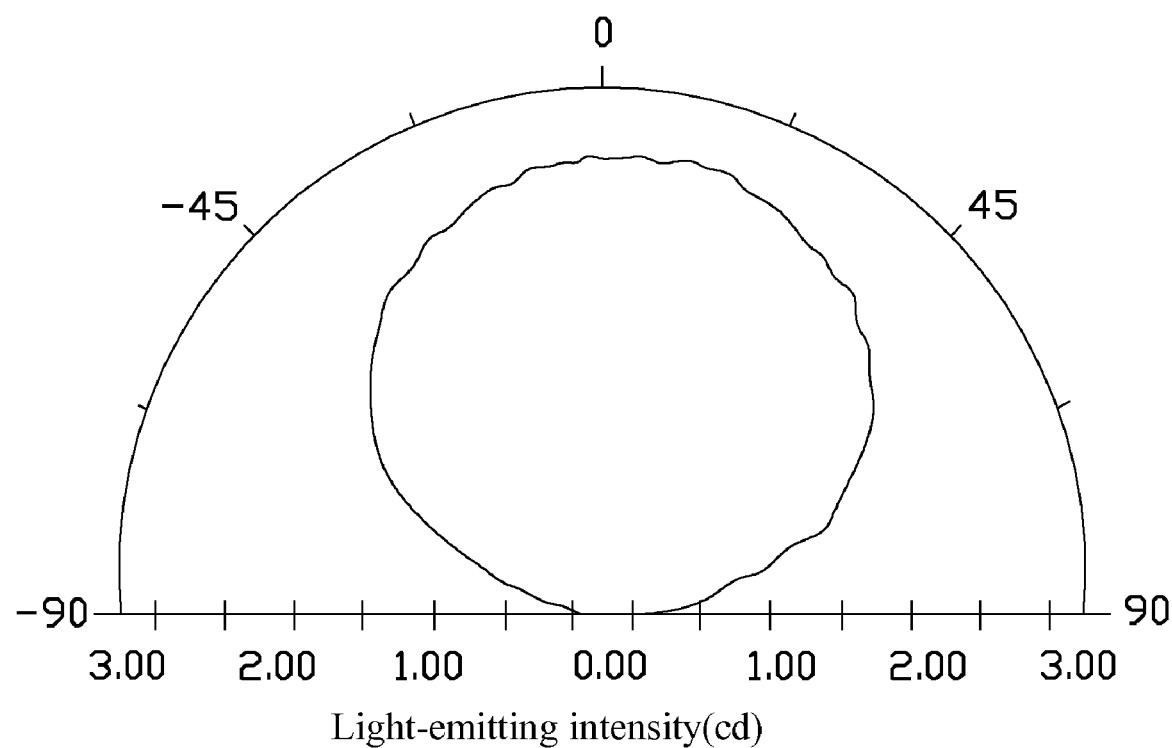
FIG. 5 illustrates a far-field pattern of the LED of FIG. 4.
Figure 6:
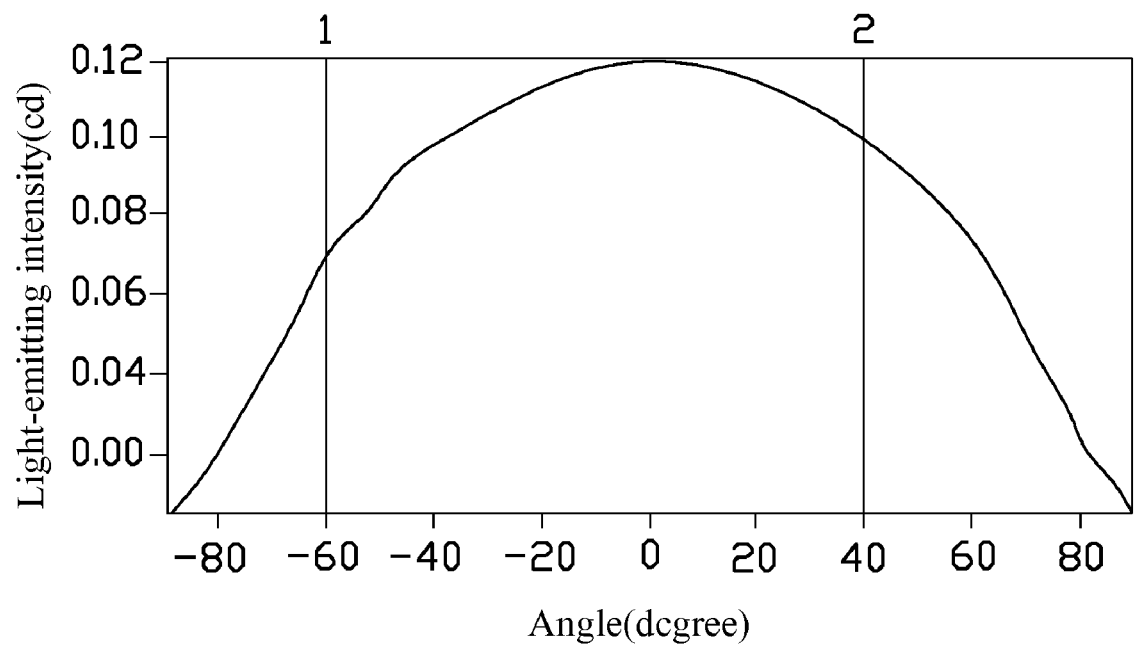
FIG. 6 illustrates the relation between the light-emitting angle and the intensity of the LED of FIG. 4.

According to the first embodiment of the present disclosure, the LED of FIG. 4 has a far-field pattern. FIG. 5 illustrates the far-field pattern of the LED of FIG. 4. In an embodiment, when the light-emitting angle of the LED 500 is at 120 degrees, the light intensity is still more than 50% of the head-on intensity. FIG. 6 illustrates the relation of the light-emitting angle and the intensity of the LED shown in FIG. 5.

Figure 1:
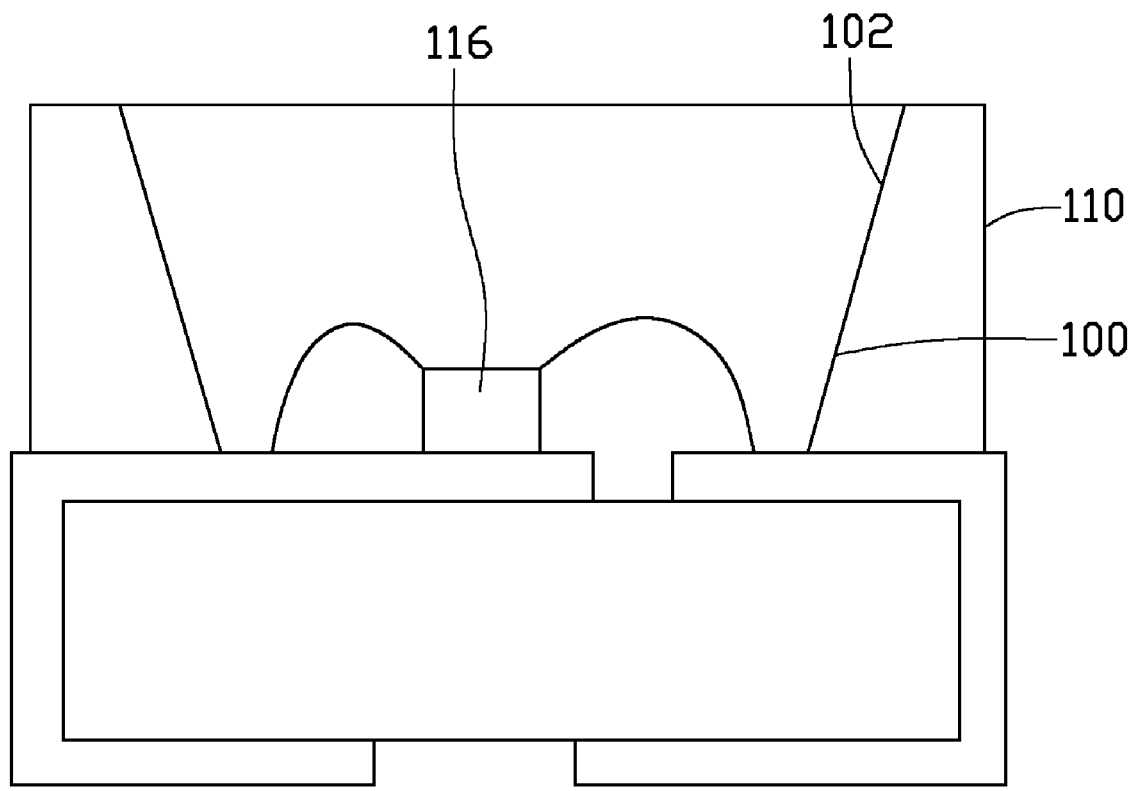
FIG. 1 illustrates a cross-sectional view of an LED in accordance with prior art.
Figure 2:
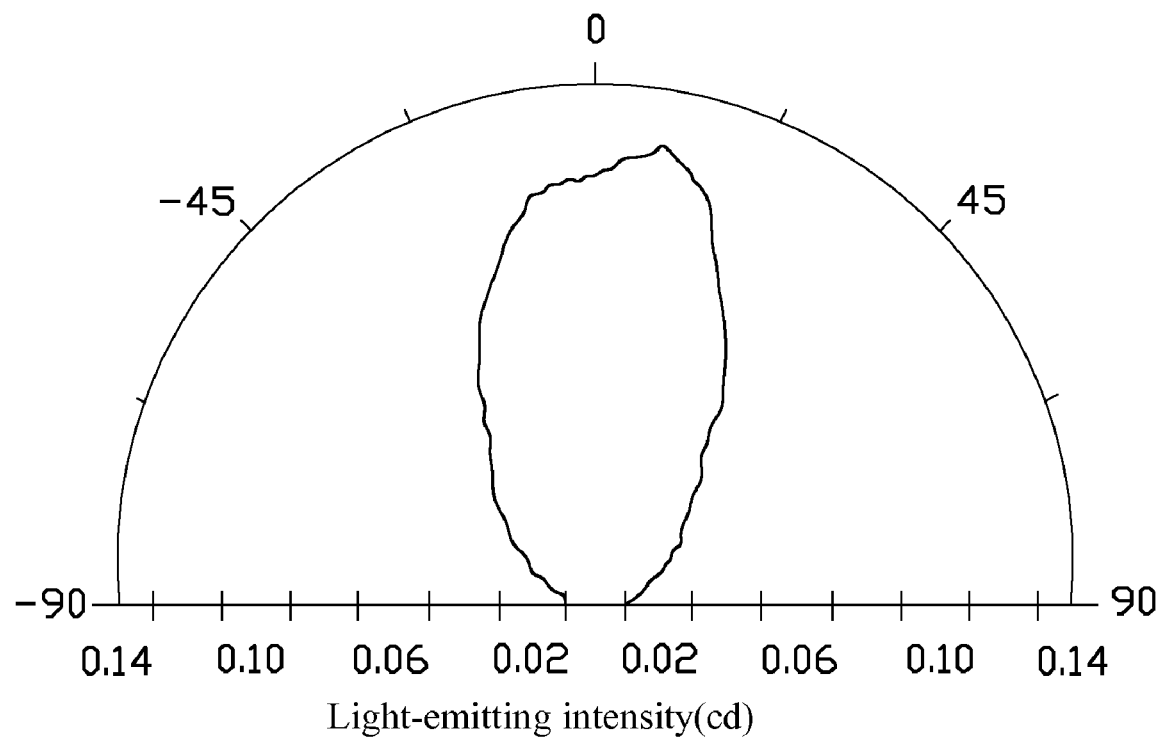
FIG. 2 illustrates a far-field pattern of the LED of FIG. 1.
Figure 3:
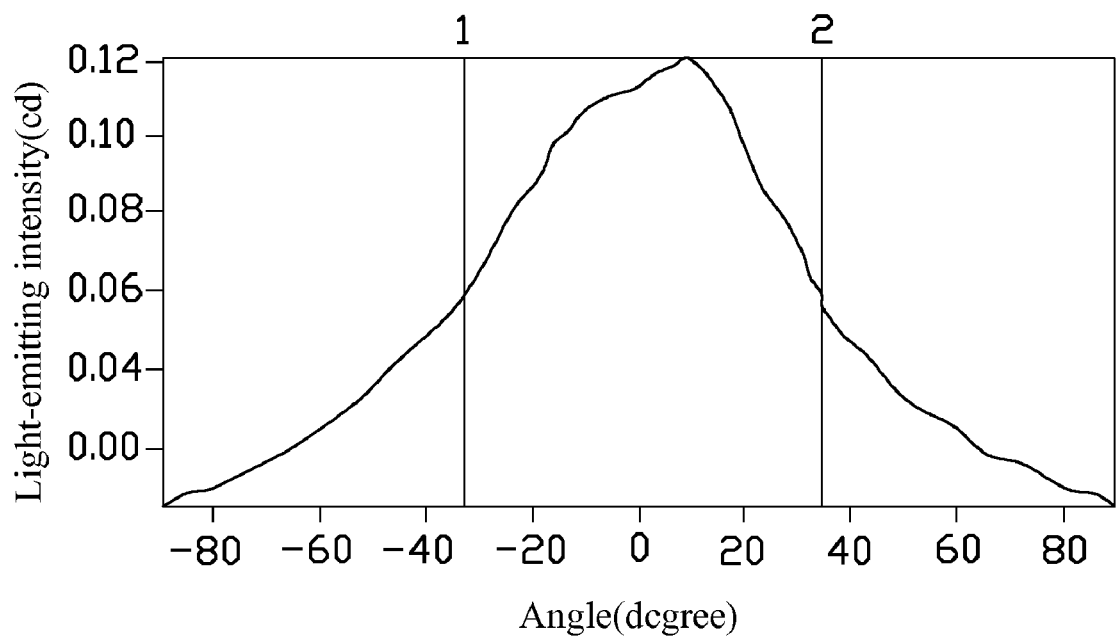
FIG. 3 illustrates the relation between the light-emitting angle and the intensity of the LED of FIG. 1.

Referring to FIG. 5 and FIG. 2, the far-field pattern 212 of the LED 500 of the first embodiment is wider than the far-field pattern 112 of the LED of FIG. 1; this is because the LED 500 has no reflection apparatus to accumulate or concentrate light.

Figure 7:
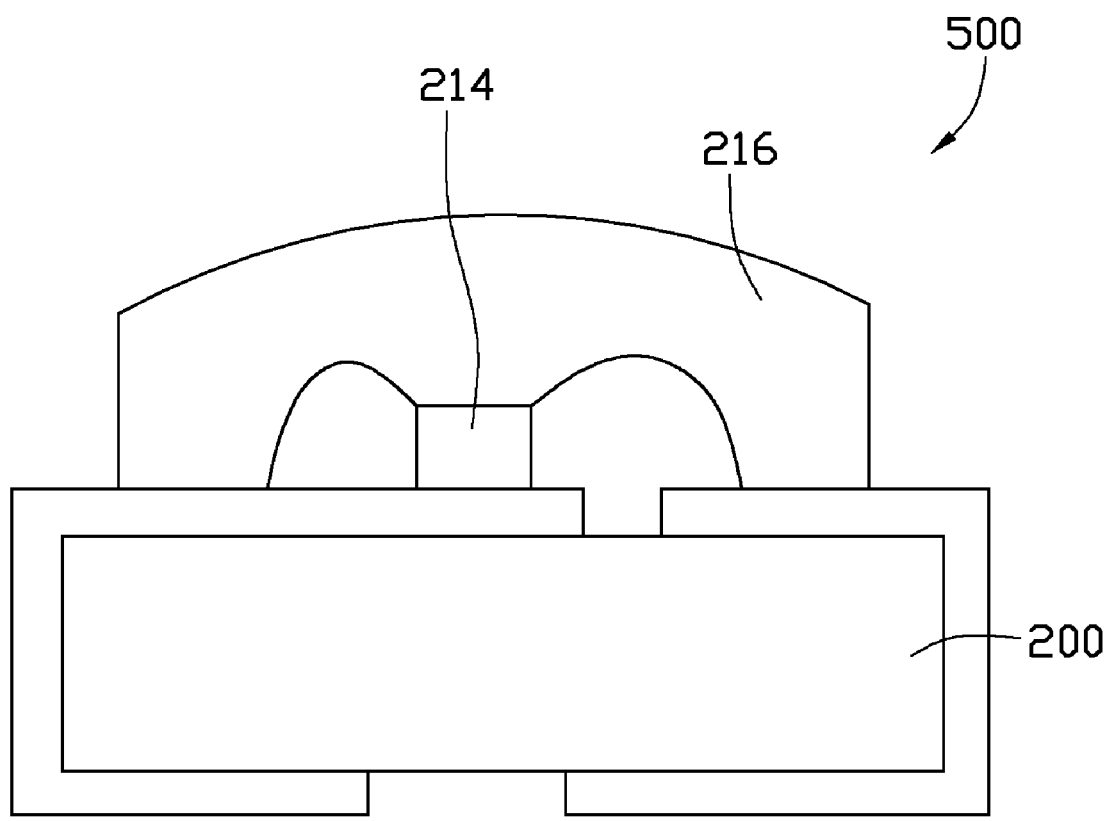
FIG. 7 illustrates the cross-sectional view of an LED in accordance with a second embodiment.

Referring to FIG. 4, the surface of the molding unit 216 of the LED 500 may be planar or in other shape or forms. FIG. 7 illustrates the cross-sectional view of an LED in accordance with a second embodiment of the present disclosure. As shown in FIG. 7, the surface of the molding unit may be convex.

Figure 8:
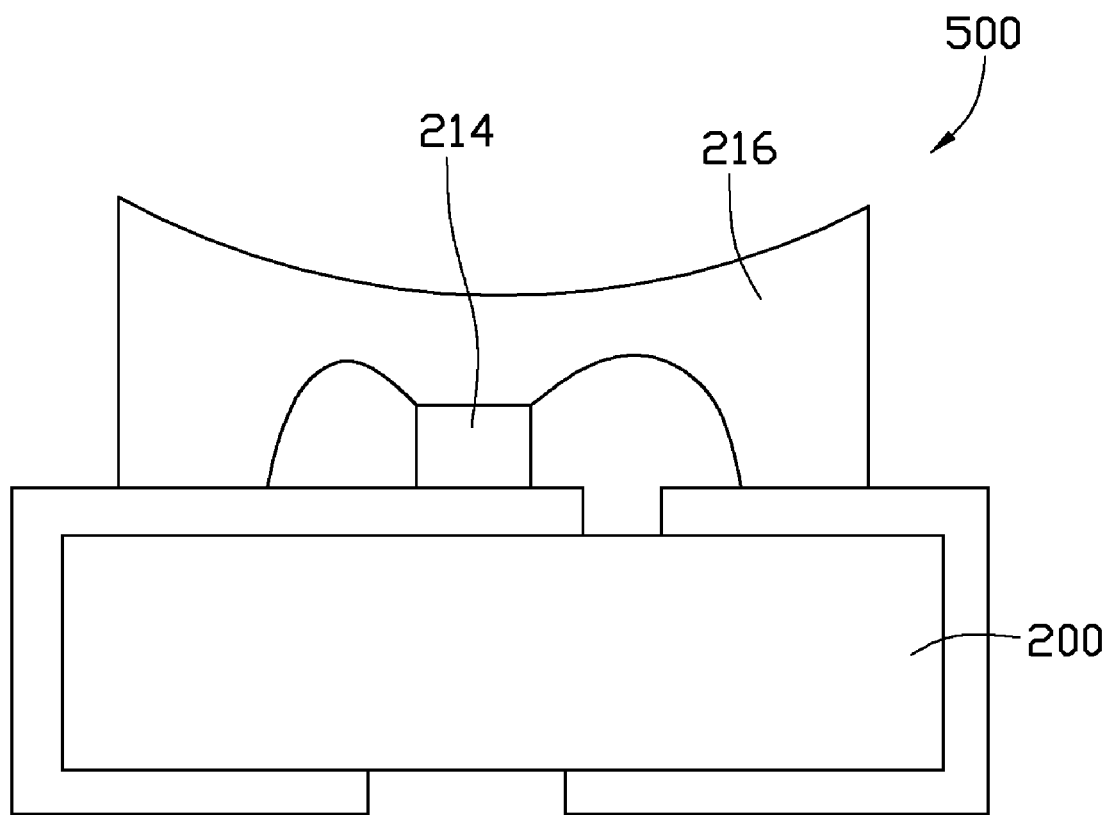
FIG. 8 illustrates the cross-sectional view of an LED in accordance with a third embodiment.

FIG. 8 illustrates the cross-sectional view of an LED in accordance with a third embodiment of the present disclosure, in which the surface of the molding unit 216 is concave.

Figure 9:
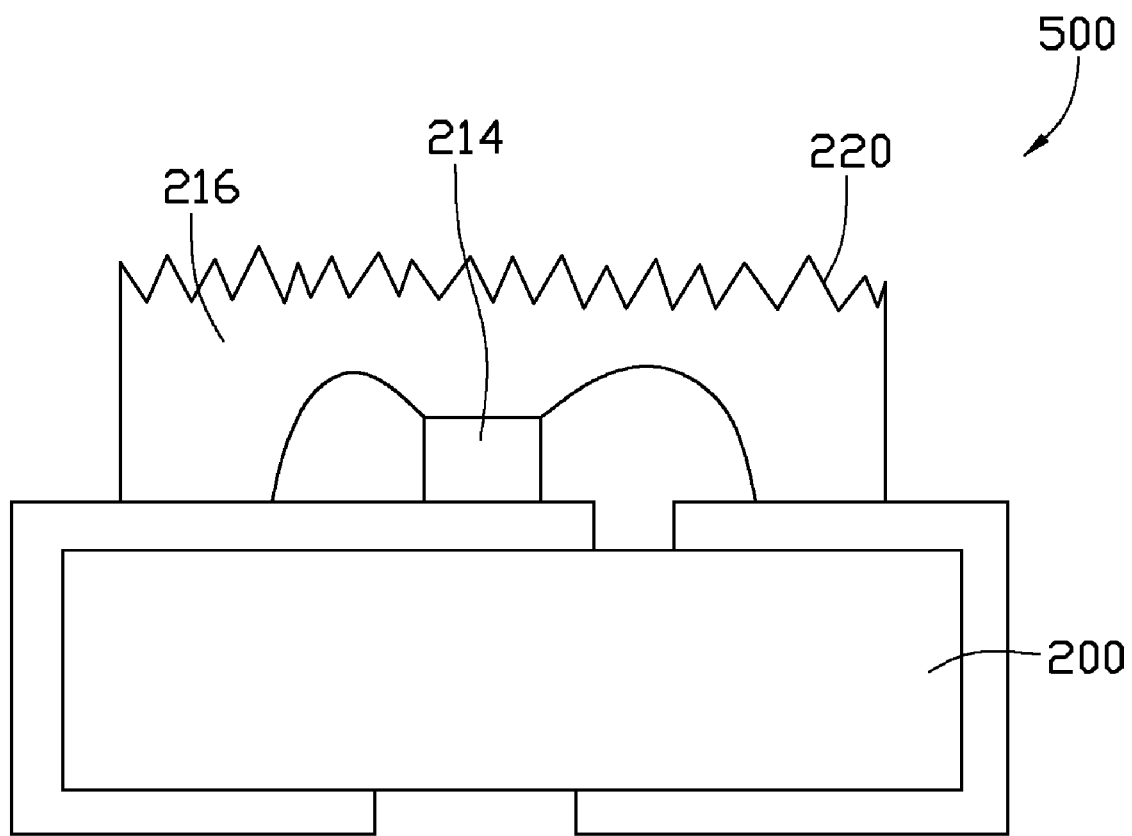
FIG. 9 illustrates the cross-sectional view of an LED in accordance with a fourth embodiment.

FIG. 9 illustrates the cross-sectional view of an LED in accordance with a fourth embodiment of the present disclosure, in which the surface of the molding unit 216 has irregular micro-structures 220.

Figure 10A:
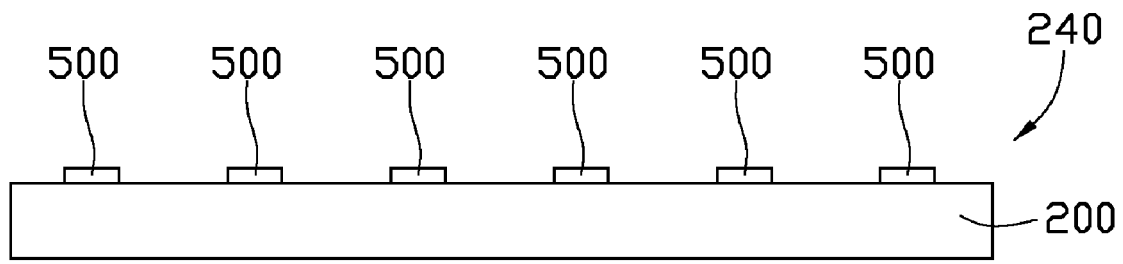
FIG. 10A illustrates the cross-sectional view of a light module in accordance with a fifth embodiment.

FIG. 10A illustrates the cross-sectional view of a light module in accordance with a fifth embodiment.

Figure 10B:
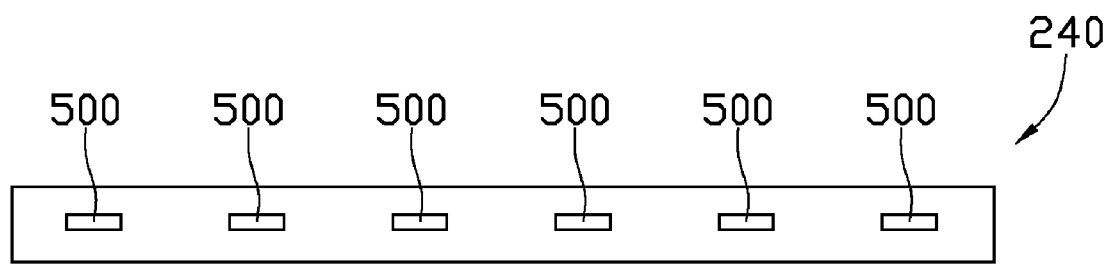
FIG. 10B illustrates the top view of the light module of FIG. 10A.

FIG. 10B illustrates the top view of the light module of FIG. 10A. Referring to FIGS. 10A and 10B, the light module 240 may include the circuit board 200 and a plurality of LEDs 500 of the first, second, third or fourth embodiments. The plurality of the LEDs 500 is arranged on the circuit board 200. None of the LEDs 500 has a reflection portion.

Figure 11:
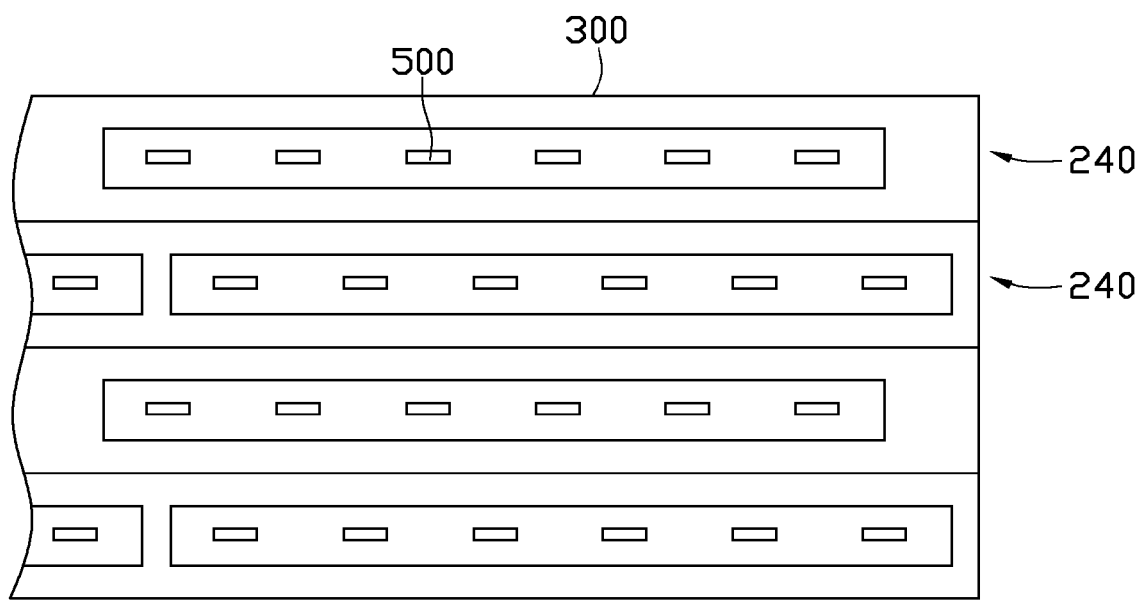
FIG. 11 illustrates the top view of a direct type light module for an LCD backlight module in accordance with a sixth embodiment.

FIG. 11 illustrates the top view of a direct type light module for LCD backlight module in accordance with a sixth embodiment. The direct type light module for an LCD backlight module may include a plurality of the light modules 240 of the fifth embodiment.

The plurality of light modules 240 is arranged with each other in one plane 300. The LEDs 500 of the light modules 240 are interlaced or stepped so as to form a planar illuminant.

One advantage of all of the above embodiments is that such implementations reduce the thickness of a backlight module. If the LEDs of the above embodiments are used for the direct type light module of the sixth embodiment, the distance between the LEDs and the light guide panel is substantially less than that of the LEDs shown in FIG. 1.

The LEDs of the disclosure have no deep cup opening, so that the LEDs can be used in the light module of the LCD backlight module of the sixth embodiment, and accordingly the backlight module can be made with a thin profile. The light-emitting area of the LED of the present disclosure is well-dispersed light so that lights can be easily mixed to function as a uniform planar illuminant for a planar light module.

Moreover, in comparison with the LEDs using plastic lead-frame chip carrier package or the bomb-type package, the first to fifth embodiments have at least one more advantage in that the encapsulation of the molding unit can be performed by transfer-molding or inject-molding processes at lower cost.

The above-described embodiments of the present disclosure are intended to be illustrative only. Those skilled in the art may devise further numerous alternative embodiments without departing from the scope of the following claims.

What is claimed is:

1. A light module for LCD backlight module comprising:
a circuit board; and
a plurality of light emitting diodes (LEDs) arranged on said circuit board, each of said LED being without any reflection portion for converging light and having a wide far-field pattern, and each of said LEDs having at least an LED chip and a molding unit packaging said LED chip;
wherein each of said LED chips is electrically connecting with said circuit board; and
wherein when a light-emitting angle of each of the LEDs is at 120 degrees, a light intensity thereof is still more than 50% of the intensity at frontage.

2. The light module for LCD backlight module as in claim 1, wherein a surface of said molding unit is planar, convexly curved, or concavely curved.

3. The light module for LCD backlight module as in claim 2, wherein the surface of said molding unit includes a plurality of irregular micro-structures.

4. The light module for LCD backlight module as in claim 1, wherein a surface of said molding unit includes a well-diversed light optical surface.

5. The light module for LCD backlight module as in claim 1, wherein said molding unit is one of epoxy, silicone, or mixture thereof.

6. The light module for LCD backlight module as in claim 1, wherein said circuit board is one of print circuit board (PCB), ceramic board, aluminum board, alumina board, aluminum nitride board, or copper clad laminate (CCL).

7. A light module for LCD backlight module comprising:
a circuit board; and
a plurality of LEDs arranged on said circuit board, each of said LEDs having an LED chip and a molding unit packaging said LED chip by transfer-molding or inject-molding;
wherein each of said LED chips is electrically connecting with said circuit board;
wherein each of said LEDs is without any reflection portion for converging light and has a wide far-field pattern; and
wherein when a light-emitting angle of each of the LEDs is at 120 degrees, a light intensity thereof is still more than 50% of the intensity at frontage.

8. The light module for LCD backlight module as in claim 7, wherein a surface of said molding unit is planar, convexly curved, or concavely curved.

9. The light module for LCD backlight module as in claim 8, wherein the surface of said molding unit includes a plurality of irregular micro-structures.

10. The light module for LCD backlight module as in claim 7, wherein said molding unit is one of epoxy, silicone, or mixture thereof.

11. The light module for LCD backlight module as in claim 7, wherein said circuit board is one of print circuit board (PCB), ceramic board, aluminum board, alumina board, aluminum nitride board, or copper clad laminate (CCL).

12. The light module for LCD backlight module as in claim 7, wherein a surface of said molding unit includes a well-diversed light optical surface.

* * * * *